United States Patent
Lindert

(10) Patent No.: US 9,076,758 B2
(45) Date of Patent: Jul. 7, 2015

(54) RECTANGULAR CAPACITORS FOR DYNAMIC RANDOM ACCESS (DRAM) AND DUAL-PASS LITHOGRAPHY METHODS TO FORM THE SAME

(71) Applicant: Nick Lindert, Beaverton, OR (US)

(72) Inventor: Nick Lindert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 14/070,893

(22) Filed: Nov. 4, 2013

(65) Prior Publication Data

US 2014/0057408 A1  Feb. 27, 2014

Related U.S. Application Data

(62) Division of application No. 12/976,550, filed on Dec. 22, 2010, now abandoned.

(51) Int. Cl.
*H01L 49/02* (2006.01)
*H01L 27/108* (2006.01)

(52) U.S. Cl.
CPC .......... *H01L 28/40* (2013.01); *H01L 27/10852* (2013.01); *H01L 28/91* (2013.01)

(58) Field of Classification Search
CPC ................ H01L 28/40; H01L 2924/00; H01L 27/10852
USPC ............................ 438/387, 396; 257/296, 306
See application file for complete search history.

(56) References Cited

U.S. PATENT DOCUMENTS

| 7,525,143 | B2 | 4/2009 | Chae |
| 2003/0142564 | A1 | 7/2003 | Forbes et al. |
| 2004/0232462 | A1 | 11/2004 | Takeuchi |
| 2005/0082586 | A1 | 4/2005 | Tu |
| 2006/0024907 | A1 | 2/2006 | Wilson |
| 2006/0131632 | A1* | 6/2006 | Chae ............................. 257/300 |
| 2007/0267674 | A1 | 11/2007 | Lin et al. |
| 2008/0128856 | A1 | 6/2008 | Kwak |
| 2010/0079924 | A1 | 4/2010 | Keating et al. |

OTHER PUBLICATIONS

International Search Report and Written Opinion from PCT/US2011/061958 mailed Jan. 17, 2013, 12 pgs.
International Preliminary Report on Patentability from PCT/US2011/061958 mailed Jul. 4, 2013, 8 pgs.
Final Office Action from U.S. Appl. No. 12/976,550 mailed Aug. 2, 2013, 12 pgs.
Non-Final Office Action from U.S. Appl. No. 12/976,550 mailed Jan. 23, 2013, 10 pgs.
Non-Final Office Action from U.S. Appl. No. 12/976,550 mailed Jun. 25, 2012, 12 pgs.

* cited by examiner

*Primary Examiner* — Cathy N Lam
(74) *Attorney, Agent, or Firm* — Blakely, Sokoloff, Taylor & Zafman LLP

(57) ABSTRACT

A rectangular capacitor for dynamic random access memory (DRAM) and a dual-pass lithography method to form the same are described. For example, a capacitor includes a trench disposed in a first dielectric layer disposed above a substrate. A cup-shaped metal plate is disposed along the bottom and sidewalls of the trench. A second dielectric layer is disposed on and conformal with the cup-shaped metal plate. A trench-fill metal plate is disposed on the second dielectric layer. The second dielectric layer isolates the trench-fill metal plate from the cup-shaped metal plate. The capacitor has a rectangular or near-rectangular shape from a top-down perspective.

6 Claims, 4 Drawing Sheets

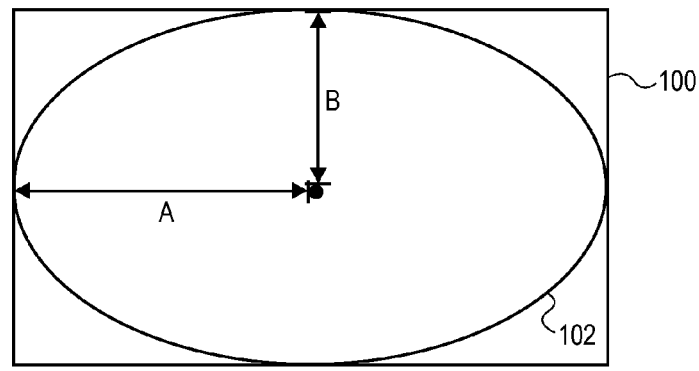
FIG. 1
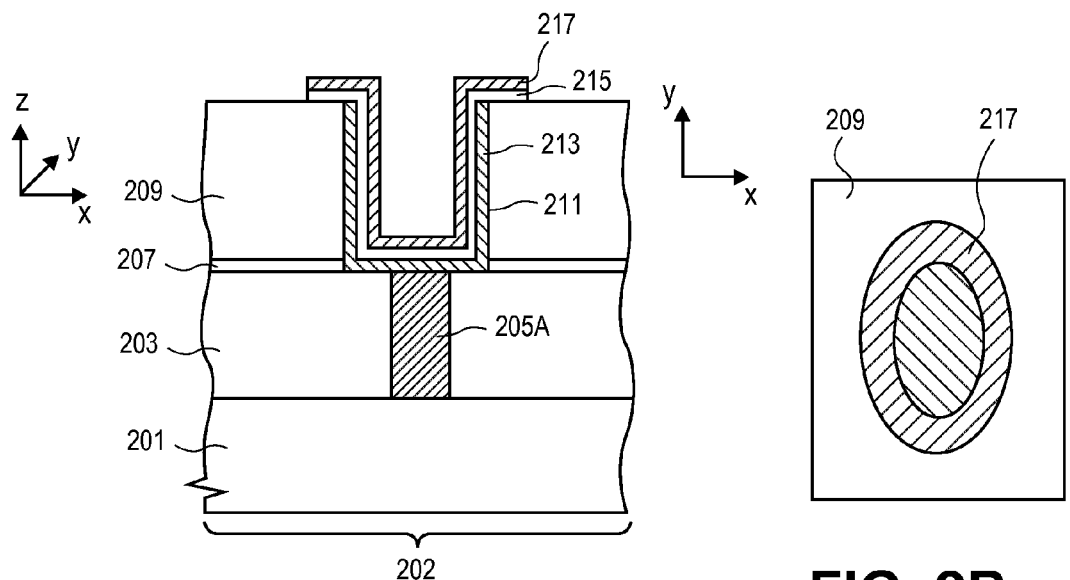
FIG. 2A
PRIOR ART
FIG. 2B
PRIOR ART

US 9,076,758 B2

RECTANGULAR CAPACITORS FOR DYNAMIC RANDOM ACCESS (DRAM) AND DUAL-PASS LITHOGRAPHY METHODS TO FORM THE SAME

CROSS-REFERENCE TO RELATED APPLICATIONS

This application is a divisional of U.S. patent application Ser. No. 12/976,550, filed on Dec. 22, 2010, the entire contents of which are hereby incorporated by reference herein.

TECHNICAL FIELD

Embodiments of the invention are in the field of dynamic random access memory and, in particular, rectangular capacitors for dynamic random access memory (DRAM) and dual-pass lithography methods to form the same.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. The capacitance of the capacitor can be enhanced by increasing the surface area of a lower electrode. Although many studies have been investigated in the area of increasing the lower electrode surface area, challenges are presented in formulating practical manufacturing processes due to the ever increasing high level of integration of semiconductor devices.

BRIEF DESCRIPTION OF THE DRAWINGS

FIG. 1 illustrates a comparison, from a top-down perspective, of a capacitor formed from a dual-pass lithography approach versus a capacitor formed from a single-pass lithography approach, in accordance with an embodiment of the present invention.

FIG. 2A illustrates a cross-sectional view of a conventional capacitor.

FIG. 2B illustrates a top-down view of a conventional capacitor.

DETAILED DESCRIPTION

Figure 3A:
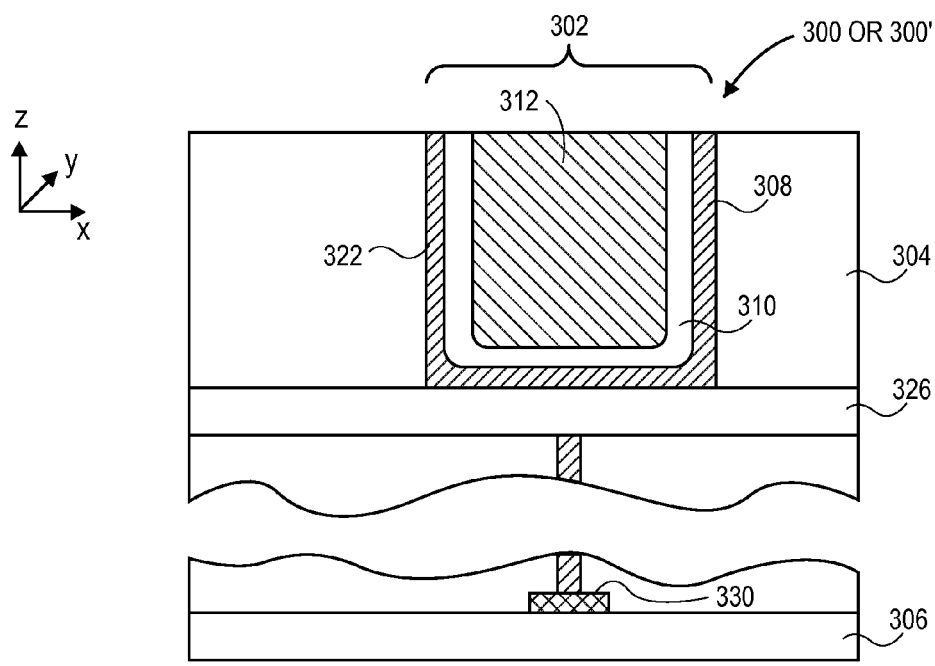
FIG. 3A illustrates a cross-sectional view of a capacitor, in accordance with an embodiment of the present invention.

Rectangular capacitors for dynamic random access memory (DRAM) and dual-pass lithography methods to form the same are described. In the following description, numerous specific details are set forth, such as layouts for capacitor arrays and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Single-pass lithography techniques involve a single exposure of a photo-resist layer and subsequent development to provide a patterned mask for use in, e.g., patterning layers used in the fabrication of semiconductor devices. Square or rectangular features often end up resulting in circular or oval mask features in single-pass lithography. While circular or oval mask features may be suitable for certain applications, others may require square or rectangular features for optimal performance.

In accordance with embodiments of the present invention, a dual pass lithography, or resist freeze, technique is used to form square or rectangular (herein referred to as "rectangular") features or near-square or near-rectangular (herein referred to as "near-rectangular") features. In particular, a dual-pass lithography approach may be used to provide capacitors for dynamic random access memory (DRAM) circuits. The approach may allow for increased critical dimension (CD) control, enabling tighter packing within an array of capacitors. The approach may also allow for increased capacitance surface area, providing more effective performance for a DRAM circuit.

FIG. 1 illustrates a comparison, from a top-down perspective, of a capacitor formed from a dual-pass lithography approach versus a capacitor formed from a single-pass lithography approach, in accordance with an embodiment of the present invention. A top-down view of a capacitor 100 formed from a dual-pass lithography approach is depicted to have an idealized rectangular geometry. On the other hand, a capacitor 102 formed from a single-pass lithography approach has an oval geometry.

The capacitance of the portion of the capacitor 100 shown in plane of FIG. 1 is 2A*2B=4AB. By contrast, capacitance of the portion of the capacitor 102 shown in plane of FIG. 1 is $\pi$*A*B. Accordingly, the capacitance of the portion of the capacitor 100 shown in plane of FIG. 1 is 1.27 times greater than the capacitance of the portion of the capacitor 102 shown in plane of FIG. 1. Additionally, the capacitance of the sidewall area (formed into the plane of FIG. 1 may be increased by using dual-pass lithography. For example, the perimeter of the capacitor 100 is 2A+2B, while the perimeter of the capacitor 102 is $2*\pi*\text{Sqrt}((A^2+B^2)/2)$. In a specific example, such a perimeter difference leads to approximately 16% more capacitance for the sidewalls of capacitor 100 as compared with capacitor 102. Overall, even accounting for non-idealities, the overall capacitance gain for a capacitor formed from a dual-pass lithography approach may be approximately in the range of 10-15% as compared with a capacitor formed from a single-pass lithography approach.

Disclosed herein are embedded metal-insulator-metal (MIM) capacitors for semiconductor devices. In one embodiment, a trench is disposed in a first dielectric layer disposed above a substrate. A cup-shaped metal plate is disposed along the bottom and sidewalls of the trench. A second dielectric layer is disposed on and conformal with the cup-shaped metal plate. A trench-fill metal plate is disposed on the second dielectric layer. The second dielectric layer isolates the trench-fill metal plate from the cup-shaped metal plate. The capacitor has a rectangular or near-rectangular shape from a top-down perspective.

Also disclosed herein are methods of fabricating embedded metal-insulator-metal (MIM) capacitors for semiconductor devices. In one embodiment, a method includes forming a first patterned photo-resist layer above a first dielectric layer above a substrate. The first patterned photo-resist layer includes a first pattern of lines along a first direction. The first patterned photo-resist layer is then hardened. Subsequently, a second patterned photo-resist layer is formed above the first patterned photo-resist layer. The second patterned photo-resist layer includes a second pattern of lines along a second direction different from the first direction. A trench is formed in the first dielectric layer using both the first patterned photo-resist layer and the second patterned photo-resist layer as a mask. A capacitor is then formed in the trench.

FIG. 2 illustrates (A) a cross-sectional view and (B) a top-down view of a conventional capacitor. Referring to FIG. 2A, a first interlayer insulating layer 203 is formed on a semiconductor substrate 201 having a cell array region 202. The first interlayer insulating layer 203 is patterned to form contact holes exposing the semiconductor substrate 201 on the cell array region 202 and the contact holes are filled with a conductive material to form a lower electrode contact plug 205a. An etch stop layer 207 and a second interlayer insulating layer 209 are sequentially formed on the resulting structure.

The second interlayer insulating layer 209 and the etch stop layer 207 are sequentially etched in the cell array region 202 to form the lower electrode contact plug 5a and a storage node hole 211 exposing the first interlayer insulating layer 203 around the lower electrode contact plug. After a lower electrode layer 213 is conformally stacked on the resulting structure, a planarization process is carried out to form a lower electrode 213 covering a bottom and an inner sidewall of the storage node hole 211. A dielectric layer 215 and an upper electrode layer 217 are sequentially stacked and patterned on the semiconductor substrate 201.

In the conventional architecture shown in FIG. 2A, methods are available for increasing the height of the lower electrode as a method for increasing the surface area of the lower electrode to increase capacitance. In one such method, the thickness of the second interlayer insulating layer where the lower electrode is positioned is increased. However, if the thickness of the second interlayer insulating layer is increased, the process burden is also increased because large amount of etching is required when the metal contact hole is formed. Thus, the reliability of the semiconductor device can be degraded. Furthermore, referring to FIG. 2B, the capacitor is conventionally formed in a single-pass lithography approach. Such an approach may lead to circular or oval top-down perimeters, as described above.

In an aspect of the present invention, an embedded metal-insulator-metal (MIM) capacitor with a rectangular or near-rectangular perimeter is provided. FIG. 3 illustrates (A) a cross-sectional view, (B) a first top-down view, and (C) a second top-down view of a capacitor, in accordance with an embodiment of the present invention.

Referring to FIG. 3A, an embedded metal-insulator-metal (MIM) capacitor 300 or 300' for a semiconductor device includes a trench 302 disposed in a first dielectric layer 304 disposed above a substrate 306. A cup-shaped metal plate 308 is disposed along the bottom and sidewalls of the trench 302. A second dielectric layer 310 is disposed on and conformal with the cup-shaped metal plate 308. A trench-fill metal plate 312 is disposed on the second dielectric layer 310. The second dielectric layer 310 isolates the trench-fill metal plate 312 from the cup-shaped metal plate 308.

Figure 3B:
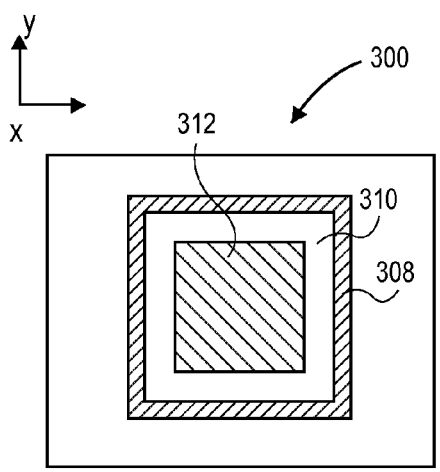
FIG. 3B illustrates a top-down view of a capacitor, in accordance with an embodiment of the present invention.
Figure 3C:
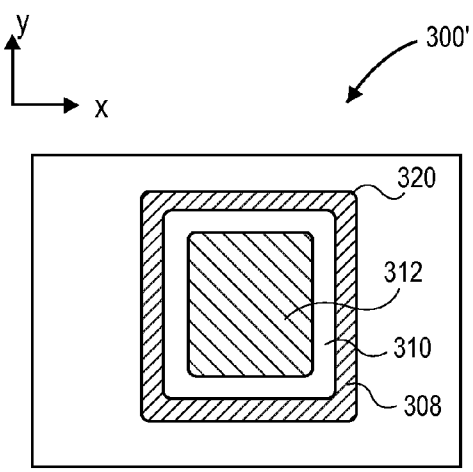
FIG. 3C illustrates a top-down view of another capacitor, in accordance with an embodiment of the present invention.

Referring to FIG. 3B, the capacitor 300 has a rectangular or near-rectangular shape from a top-down perspective, with an ideally rectangular perimeter depicted in FIG. 3B. Referring to FIG. 3C, in accordance with an embodiment of the present invention, the capacitor 300' has a near-rectangular shape with slightly rounded corners 320. In an embodiment, referring again to FIG. 3A, the sidewalls 322 of the trench 302 have a vertical or near-vertical profile.

Referring again to FIG. 3A, in an embodiment, the cup-shaped metal plate 308 is electrically coupled to an underlying transistor 330 disposed above the substrate 306. In one embodiment, the transistor 330 is included in a dynamic random access memory (DRAM circuit). In a specific embodiment, the cup-shaped metal plate 308 is electrically coupled to the underlying transistor 330 by a floor metal layer 326, such as a copper layer, disposed below the first dielectric layer 304.

In an embodiment, the cup-shaped metal plate 308 is composed of a copper layer proximate to the bottom of the trench 302 and distal from the second dielectric layer 310, and is further composed of a metal nitride layer proximate to the second dielectric layer 310 and distal from the bottom of the trench 302. In an embodiment, the trench-fill metal plate 312 is composed of copper. In one embodiment, the metal nitride layer is a tantalum nitride layer or a titanium nitride layer. In an embodiment, one or more of the copper layer or the metal nitride layer of the cup-shaped metal plate 308 or the copper of the trench-fill metal plate 312 is formed by a technique such as, but not limited to, an electro-chemical deposition process, an electro-less deposition process, a chemical vapor deposition process, an atomic layer deposition (ALD) process, or a reflow process. It is to be understood that silver, aluminum, or an alloy of copper, silver or aluminum may be used in place of the above described copper. Also, the cup-shaped metal plate 308 may be a single layer feature formed from copper, silver, aluminum, or an alloy thereof. In an alternative embodiment, trench-fill metal plate 312 includes a multiple layer structure.

In an embodiment, the first dielectric layer 304 is a low-K dielectric layer (a layer with a dielectric constant less than 4 for silicon dioxide). In one embodiment, the first dielectric layer 304 is formed by a process such as, but not limited to, a spin-on process, a chemical vapor deposition process, or a polymer-based chemical vapor deposition process. In a specific embodiment, the first dielectric layer 304 is formed by a chemical vapor deposition process involving silane or an organo-silane as a precursor gas. In an embodiment, the first dielectric layer 304 is composed of a material that does not significantly contribute to leakage current between a series of metal interconnects subsequently formed in or on the first dielectric layer 304. In one embodiment, the first dielectric layer 304 is composed of a material in the range of 2.5 to less than 4. In a particular embodiment, the first dielectric layer 304 is composed of a material such as, but not limited to, a silicate or a carbon-doped oxide with 0-10% porosity. In another embodiment, however, the first dielectric layer 304 is composed of silicon dioxide.

In an embodiment, the second dielectric layer 310 is composed a high-K dielectric layer (a layer with a dielectric constant greater than 4 for silicon dioxide). In one embodiment, the second dielectric layer 310 is formed by an atomic vapor deposition process or a chemical vapor deposition process and is composed of a material such as, but not limited to, silicon oxy-nitride, hafnium oxide, zirconium oxide, hafnium silicate, hafnium oxy-nitride or lanthanum oxide. In another embodiment, however, the second dielectric layer 310 is composed of silicon dioxide.

In an embodiment, substrate 306 is composed of a material suitable for semiconductor device fabrication. In one embodiment, substrate 306 is a bulk substrate composed of a single crystal of a material which may include, but is not limited to, silicon, germanium, silicon-germanium or a III-V compound semiconductor material. In another embodiment, substrate 306 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 306 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 306 may further include dopant impurity atoms.

In accordance with an embodiment of the present invention, substrate 306 has thereon an array of complimentary metal-oxide-semiconductor (CMOS) transistors fabricated in a silicon substrate and encased in a dielectric layer. A plurality of metal interconnects may be formed above the transistors, and on the surrounding dielectric layer, and are used to electrically connect the transistors to form an integrated circuit. In one embodiment, the integrated circuit is used for a DRAM.

Although only a single capacitor was described in association with FIG. 3, an array of capacitors may be included in a single product. By forming capacitors with rectangular or near-rectangular perimeters, from a top-down perspective, increased critical dimension (CD) control may be achieved, enabling tighter packing within the array of capacitors. For example, in accordance with an embodiment of the present invention, electrical results show that with similar spacing the rectangular shape provides an extra 12% capacitance over the oval shape. Additionally, resulting from the improved CD control, capacitor-to-capacitor spacing can be reduced. Such a reduction in spacing, i.e. increase in packing density, may provide up to, or even more than, a 30% capacitance increase with dual-pass lithography versus single-pass lithography.

Thus, in an aspect of the present invention, an array of embedded metal-insulator-metal (MIM) capacitors with rectangular or near-rectangular perimeters is provided. FIG. 4 illustrates a top-down view of (A) a conventional array of capacitors, and (B) an array of rectangular or near-rectangular capacitors, in accordance with an embodiment of the present invention.

Figures 4A, 4B:
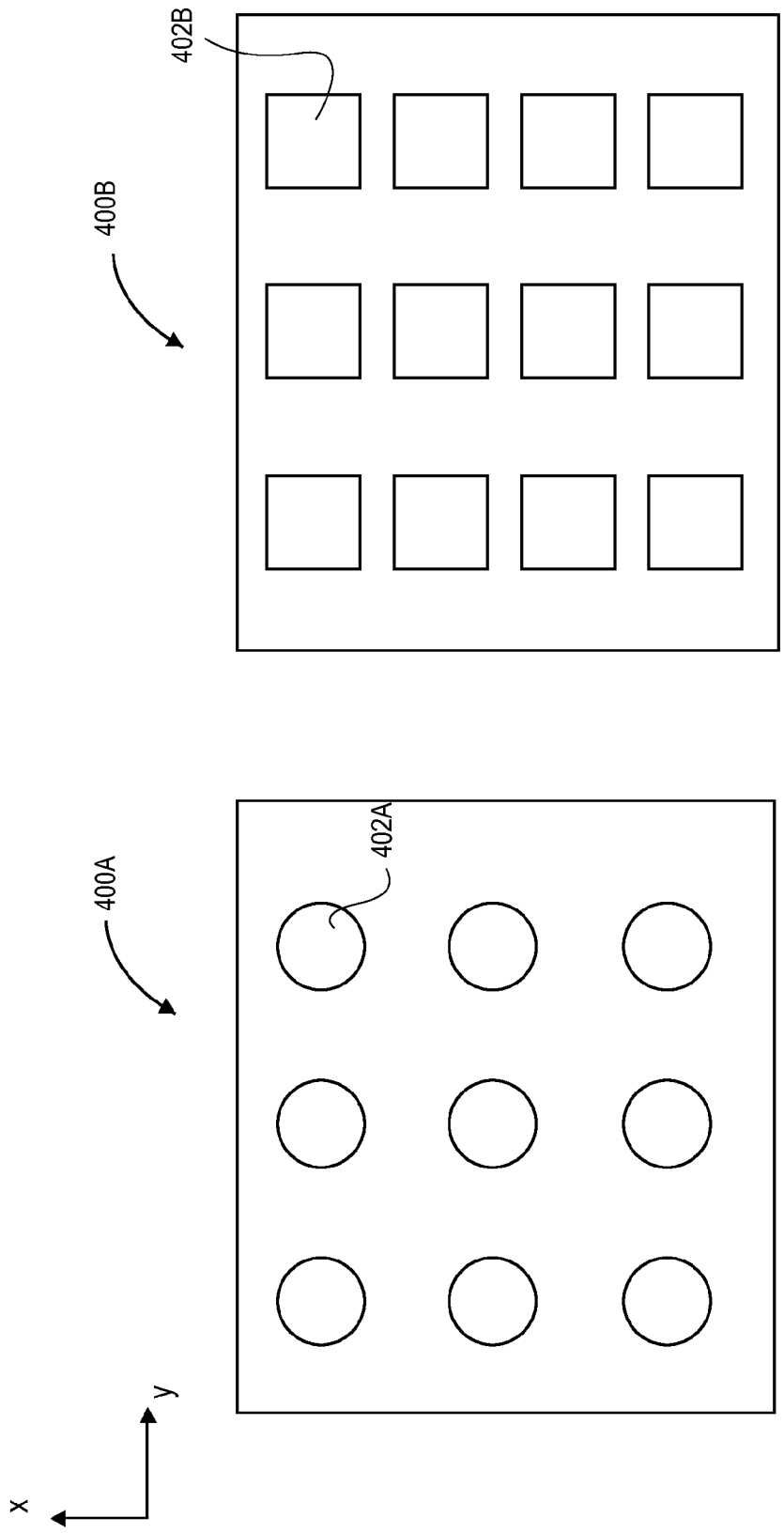
FIG. 4A illustrates a top-down view of a conventional array of capacitors.
FIG. 4B illustrates a top-down view of an array of rectangular or near-rectangular capacitors, in accordance with an embodiment of the present invention.

Referring to FIG. 4A, a conventional array of capacitors 400A has an array of oval perimeters 402A from a top-down perspective. Such an array may be formed by a single-pass lithography approach. By contrast, referring to FIG. 4B, in an aspect of the present invention, an array of capacitors 400B has an array of rectangular or near-rectangular perimeters 402B from a top-down perspective. Such an array may be formed by a dual-pass lithography approach.

Referring again to FIG. 4B, an array 400B of embedded metal-insulator-metal (MIM) capacitors for, e.g., an array of semiconductor devices is depicted. The capacitors include a plurality of trenches disposed in a first dielectric layer disposed above a substrate. A plurality of cup-shaped metal plates is included, each disposed along the bottom and sidewalls of a corresponding trench. A plurality of second dielectric layers is also included, each disposed on and conformal with a corresponding cup-shaped metal plate. A plurality of trench-fill metal plates is also included, each disposed on a corresponding second dielectric layer, the second dielectric layer isolating the corresponding trench-fill metal plate from the corresponding cup-shaped metal plate. The array of capacitors forms a grid pattern as depicted in FIG. 4B. Furthermore, each of the capacitors has a rectangular or near-rectangular shape from a top-down perspective, as depicted in FIGS. 3B and 4B. In one embodiment, from the top-down perspective, each capacitor has the near-rectangular shape with slightly rounded corners, as depicted in and described in association with FIG. 3C.

In an embodiment, the sidewalls of each trench have a vertical or near-vertical profile. In an embodiment, each cup-shaped metal plate is electrically coupled to an underlying transistor disposed above the substrate. In one embodiment, the transistor is included in a dynamic random access memory (DRAM circuit). In a specific embodiment, each cup-shaped metal plate is electrically coupled to the underlying transistor by a floor metal layer disposed below the first dielectric layer. In an embodiment, each cup-shaped metal plate is composed of a copper layer proximate to the bottom of the corresponding trench and distal from the corresponding second dielectric layer, and is also composed of a metal nitride layer proximate to the corresponding second dielectric layer and distal from the bottom of the corresponding trench. In an embodiment, each trench-fill metal plate is composed of copper. In an embodiment, the first dielectric layer is a low-K dielectric layer. In an embodiment, each second dielectric layer is a high-K dielectric layer.

In another aspect of the present invention, a method of fabricating an embedded metal-insulator-metal (MIM) capacitor for semiconductor devices is provided.

Figure 5:
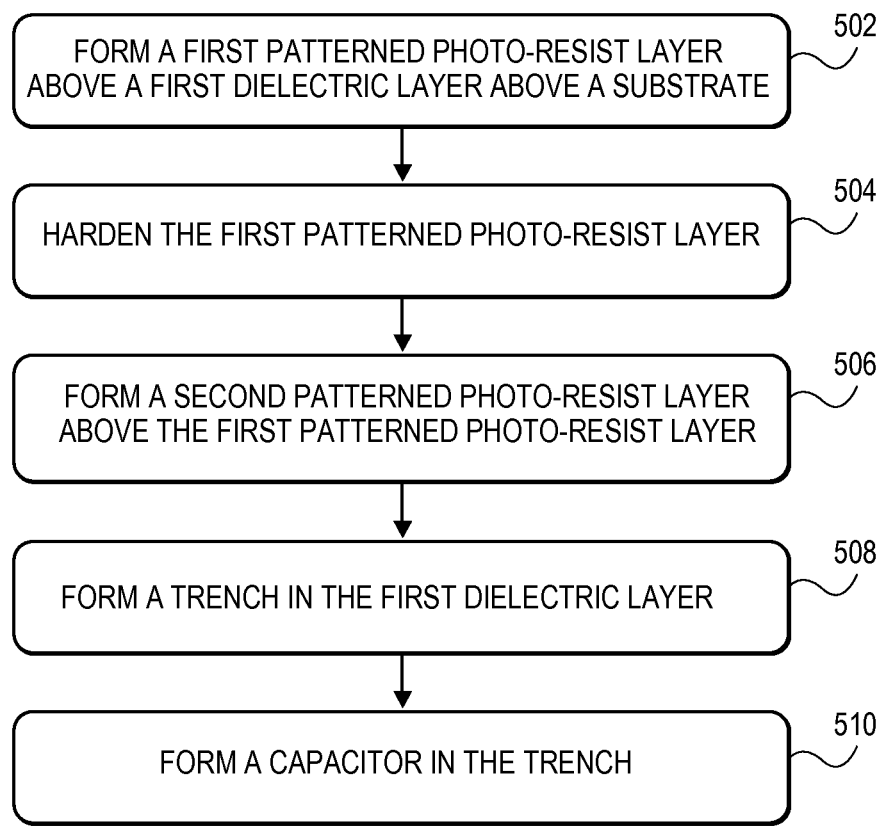
FIG. 5 is a Flowchart representing operations in a method of forming an embedded metal-insulator-metal (MIM) capacitor in accordance with an embodiment of the present invention.

FIG. 5 is a Flowchart 500 representing operations in a method of forming an embedded metal-insulator-metal (MIM) capacitor in accordance with an embodiment of the present invention.

Referring to operation 502 of Flowchart 500, a first patterned photo-resist layer is formed above a first dielectric layer above a substrate. The first patterned photo-resist layer has a first pattern of lines along a first direction. A photo-resist layer used to form the first patterned photo-resist layer may be composed of a material suitable for use in a lithographic process. In one embodiment, the photo-resist layer is formed by first masking a blanket layer of photo-resist material. The blanket layer of photo-resist material is then exposed to a light source and subsequently developed, e.g., by treating with a wet chemical solution, to provide the first patterned photo-resist layer.

In an embodiment, the portions of the photo-resist layer exposed to the light source are removed upon developing the photo-resist layer. Thus, in an embodiment, the photo-resist layer is composed of a positive photo-resist material. In a specific embodiment, the photo-resist layer is composed of a positive photo-resist material such as, but not limited to, a 248 nm resist, a 193 nm resist, a 157 nm resist or a phenolic resin matrix with a diazonaphthoquinone sensitizer. In another embodiment, the portions of the photo-resist layer exposed to the light source are retained upon developing the photo-resist layer. Thus, in another embodiment, the photo-resist layer is composed of a negative photo-resist material. In a specific embodiment, the photo-resist layer is composed of a negative photo-resist material such as, but not limited to, poly-cis-isoprene or poly-vinyl-cinnamate.

Referring to operation 504 of Flowchart 500, the first patterned photo-resist layer is hardened. In accordance with an embodiment of the present invention, the first patterned photo-resist layer is hardened to a degree suitable to withstand formation of a second patterned photo-resist layer on or above the first patterned photo-resist layer. In one embodiment, the first patterned photo-resist layer is hardened through a technique such as, but not limited to, a curing process or a freezing process.

Referring to operation 506 of Flowchart 500, subsequent to hardening the first patterned photo-resist layer, a second patterned photo-resist layer is formed above the first patterned photo-resist layer. The second patterned photo-resist layer has a second pattern of lines along a second direction different from the first direction. In accordance with an embodiment of the present invention, the first direction is orthogonal to the second direction. The second patterned photo-resist layer may be formed in the same or similar manner and from the same or similar material as the first patterned photo-resist layer, described above.

Referring to operation 508 of Flowchart 500, a trench is formed in the first dielectric layer using both the first patterned photo-resist layer and the second patterned photo-resist layer as a mask. In accordance with an embodiment of the present invention, the sidewalls of the trench have a vertical or near-vertical profile.

Referring to operation 510 of Flowchart 500, a capacitor is formed in the trench. In accordance with an embodiment of the present invention, the capacitor has a rectangular or near-rectangular shape from a top-down perspective. In one embodiment, from the top-down perspective, the capacitor has the near-rectangular shape with slightly rounded corners.

In an embodiment, forming the capacitor includes forming a cup-shaped metal plate along the bottom and sidewalls of the trench, forming a second dielectric layer on and conformal with the cup-shaped metal plate, and forming a trench-fill metal plate on the second dielectric layer, the second dielectric layer isolating the trench-fill metal plate from the cup-shaped metal plate. In one embodiment, the cup-shaped metal plate is composed of a copper layer proximate to the bottom of the trench and distal from the second dielectric layer, and is further composed of a metal nitride layer proximate to the second dielectric layer and distal from the bottom of the trench. The trench-fill metal plate is composed of copper. In one embodiment, the first dielectric layer is a low-K dielectric layer, and the second dielectric layer is a high-K dielectric layer.

In an embodiment, the method of forming an embedded metal-insulator-metal (MIM) capacitor further includes electrically coupling the capacitor to an underlying transistor disposed above the substrate. In one embodiment, the transistor is included in a dynamic random access memory (DRAM circuit). In one embodiment, the cup-shaped metal plate is electrically coupled to the underlying transistor by a floor metal layer disposed below the first dielectric layer.

Thus, rectangular capacitors for dynamic random access memory (DRAM) and dual-pass lithography methods to form the same have been disclosed. In an embodiment, a capacitor includes a trench disposed in a first dielectric layer disposed above a substrate. A cup-shaped metal plate is disposed along the bottom and sidewalls of the trench. A second dielectric layer is disposed on and conformal with the cup-shaped metal plate. A trench-fill metal plate is disposed on the second dielectric layer. The second dielectric layer isolates the trench-fill metal plate from the cup-shaped metal plate. The capacitor has a rectangular or near-rectangular shape from a top-down perspective. In one embodiment, from the top-down perspective, the capacitor has the near-rectangular shape with slightly rounded corners. In one embodiment, the sidewalls of the trench have a vertical or near-vertical profile. In one embodiment, the cup-shaped metal plate is electrically coupled to an underlying transistor disposed above the substrate, and the transistor included in a dynamic random access memory (DRAM) circuit.

What is claimed is:

1. A method of forming an embedded metal-insulator-metal (MIM) capacitor for a semiconductor device, the method comprising:
    forming a first patterned photo-resist layer above a first dielectric layer above a substrate, the first patterned photo-resist layer comprising a first pattern of lines along a first direction;
    hardening the first patterned photo-resist layer; and, subsequently,
    forming a second patterned photo-resist layer above the first patterned photo-resist layer, the second patterned photo-resist layer comprising a second pattern of lines along a second direction different from the first direction;
    forming a trench in the first dielectric layer using both the first patterned photo-resist layer and the second patterned photo-resist layer as a mask; and
    forming the capacitor in the trench.

2. The method of claim 1, wherein the first direction is orthogonal to the second direction.

3. The method of claim 1, wherein the capacitor has a rectangular or near-rectangular shape from a top-down perspective.

4. The method of claim 1, wherein forming the capacitor comprises:
    forming a cup-shaped metal plate along the bottom and sidewalls of the trench;
    forming a second dielectric layer on and conformal with the cup-shaped metal plate; and
    forming a trench-fill metal plate on the second dielectric layer, the second dielectric layer isolating the trench-fill metal plate from the cup-shaped metal plate.

5. The method of claim 1, wherein forming the first and second patterned photo-resist layers comprises forming positive photo-resist layers.

6. The method of claim 1, further comprising:
electrically coupling the capacitor to an underlying transistor disposed above the substrate, the transistor included in a dynamic random access memory (DRAM) circuit.

* * * * *